(12) United States Patent
Coleman et al.

(10) Patent No.: US 9,306,353 B2
(45) Date of Patent: Apr. 5, 2016

(54) INTEGRATED ROTARY JOINT ASSEMBLY WITH INTERNAL TEMPERATURE-AFFECTING ELEMENT

(71) Applicants: Donnie S. Coleman, Dublin, VA (US); Michael H. Harris, Blacksburg, VA (US); Terry A. Willemin, Blacksburg, VA (US)

(72) Inventors: Donnie S. Coleman, Dublin, VA (US); Michael H. Harris, Blacksburg, VA (US); Terry A. Willemin, Blacksburg, VA (US)

(73) Assignee: Moog Inc., East Aurora, NY (US)

( * ) Notice: Subject to any disclaimer, the term of this patent is extended or adjusted under 35 U.S.C. 154(b) by 92 days.

(21) Appl. No.: 13/904,277

(22) Filed: May 29, 2013

(65) Prior Publication Data

US 2014/0354379 A1 Dec. 4, 2014

(51) Int. Cl.
| | | |
|---|---|---|
| H01R 39/10 | (2006.01) | |
| H01R 39/64 | (2006.01) | |
| H01R 13/533 | (2006.01) | |
| H02K 9/22 | (2006.01) | |
| H02K 9/28 | (2006.01) | |
| H01R 107/00 | (2006.01) | |
| H05K 1/02 | (2006.01) | |

(52) U.S. Cl.
CPC .............. *H01R 39/10* (2013.01); *H01R 13/533* (2013.01); *H01R 39/64* (2013.01); *H02K 9/22* (2013.01); *H02K 9/28* (2013.01); *H01R 2107/00* (2013.01); *H05K 1/0212* (2013.01); *H05K 2201/09027* (2013.01)

(58) Field of Classification Search
CPC ...... H01R 39/64; H01R 39/10; H01R 13/533; H02K 9/28; H02K 9/22
USPC ............ 333/261, 24 R; 310/231, 232; 439/13
See application file for complete search history.

(56) References Cited

U.S. PATENT DOCUMENTS

| | | | |
|---|---|---|---|
| 4,334,159 A | 6/1982 | Ooki et al. | |
| 5,810,606 A * | 9/1998 | Ballast et al. | 439/15 |
| 6,356,002 B1 | 3/2002 | Witherspoon | |
| 6,433,631 B2 | 8/2002 | Pearson | |

(Continued)

FOREIGN PATENT DOCUMENTS

| | | |
|---|---|---|
| EP | 2696449 B1 | 2/2014 |
| JP | 49105106 A | 10/1974 |

OTHER PUBLICATIONS

Glenn Dorsey, PE , "Advanced High Lift System Architecture with Distributed Electrical Flap Actuation," #311 at http://www.moog.com/literature/MCG/311_When_Ethernet_Rotates_White_Paper.pdf, 2012, H01R39/64; XP055140724.

(Continued)

*Primary Examiner* — Benny Lee
(74) *Attorney, Agent, or Firm* — Phillips Lytle LLP

(57) ABSTRACT

An improved slip-ring has a stator and a rotor, and includes a brush having a proximal end mounted on one of the stator and rotor and having a distal end engaging the other of the stator and rotor. The brush is adapted to convey electrical signals across the interface between the stator and rotor. The improvement includes: the rotor including a support member (1); and a track provided on the other of the stator and rotor, the track being arranged for sliding contact with the brush distal end; and a thermal element (3 or 6) arranged within the support member for selectively affecting the temperature of the rotor; whereby the temperature operating range of the slip-ring may be increased.

8 Claims, 4 Drawing Sheets

(56) References Cited

U.S. PATENT DOCUMENTS

| | | |
|---|---|---|
| 6,437,656 B1 | 8/2002 | Guynn |
| 6,502,298 B1 | 1/2003 | Witherspoon |
| 6,956,445 B2 | 10/2005 | Coleman |
| 6,984,915 B2 | 1/2006 | Galyean |
| 7,142,071 B2 | 11/2006 | Coleman |
| 7,242,071 B1 | 7/2007 | Liu |
| 7,559,767 B2 | 7/2009 | Coleman |
| 8,283,993 B2 | 10/2012 | Coleman |
| 2004/0169434 A1 | 9/2004 | Washington et al. |
| 2011/0198965 A1* | 8/2011 | Krogh et al. .............. 310/227 |
| 2012/0200194 A1* | 8/2012 | Schwery et al. ........... 310/227 |
| 2014/0038433 A1* | 2/2014 | Rehder et al. ............... 439/18 |

OTHER PUBLICATIONS

Dorsey, G, et al, High Speed Data Across Sliding Electrical Contacts. IEEE Holm Conference, 2012, Portland, OR.

Glenn Dorsey, PE, "High Performance Sensor Data with Rotary Interfaces," #313 at Moog-HighPerfSensorData.pdf; http://www.rettiginc.com/articles/Moog-HighPerfSensorData.pdf; 2014; H01R39/64.

Glenn Dorsey, PE, "Video Signals and Slip Rings," #312 at http://www.moog.com/literature/MCG/312_VideoSignals_SlipRings_WhitePaper.pdf; 2013; H01R39/64.

The International Search Report (ISR) of the searching authority for PCT Application Serial No. PCT/US2014/038892; Publication No. WO/2014/204607 A1; dated Oct. 10, 2014.

* cited by examiner

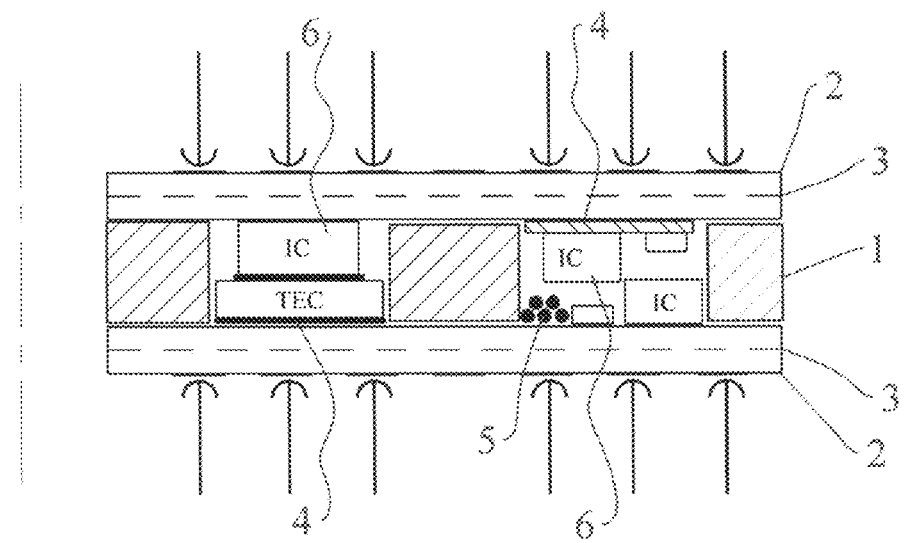
Fig. 1: Integrated Slip-Ring Assembly with Active Electronics
6-Layer Board with Heating Layers
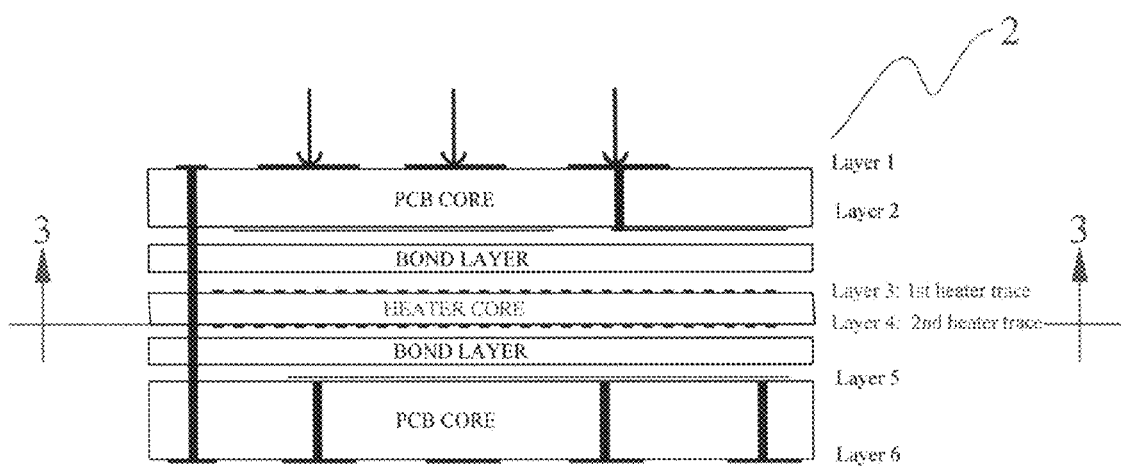
Fig. 2: 6-Layer Printed Circuit Board with Internal Heating Structures

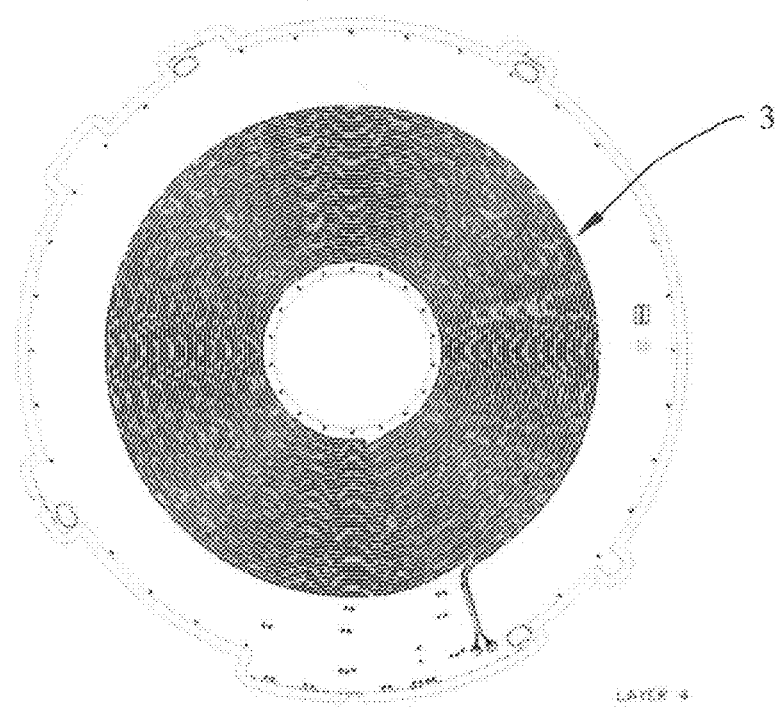
Fig. 3: Serpentine heating element implemented as traces on a PCB layer
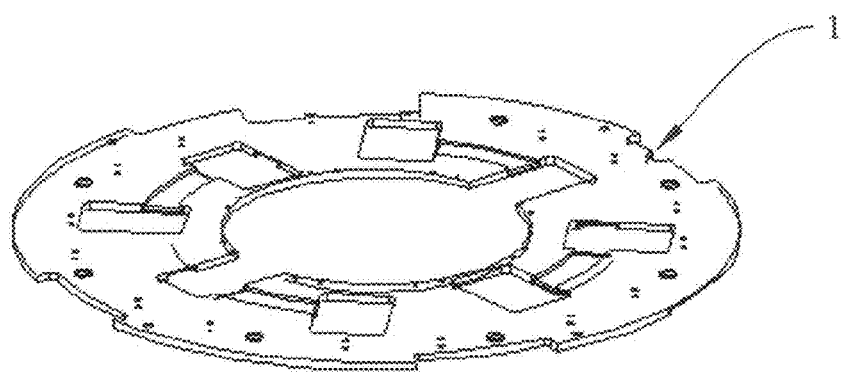
Fig. 4: Radial support structure

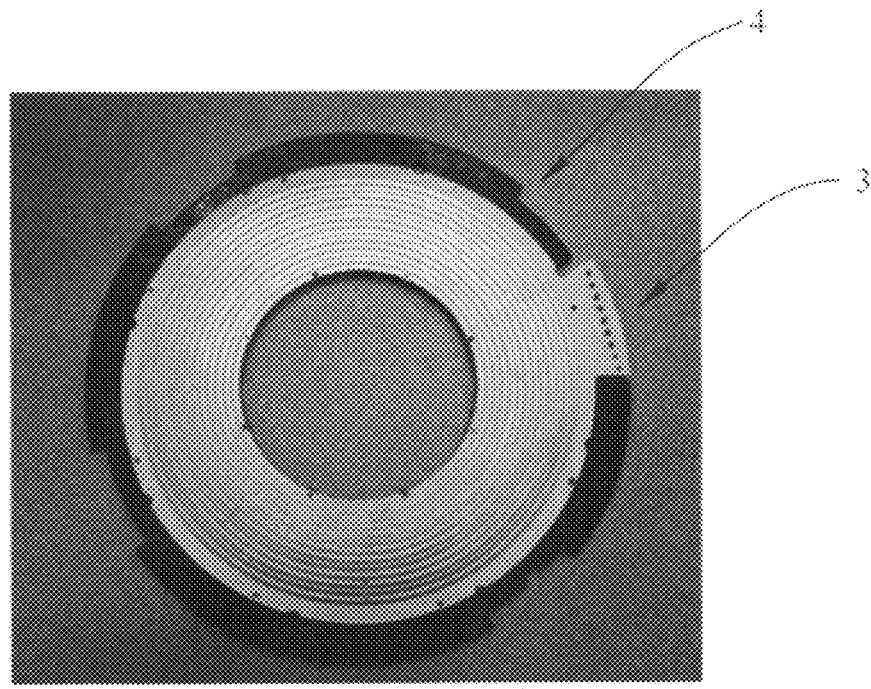
Fig. 5: Prototype Rotary Joint With Carbon Fiber Radial Support
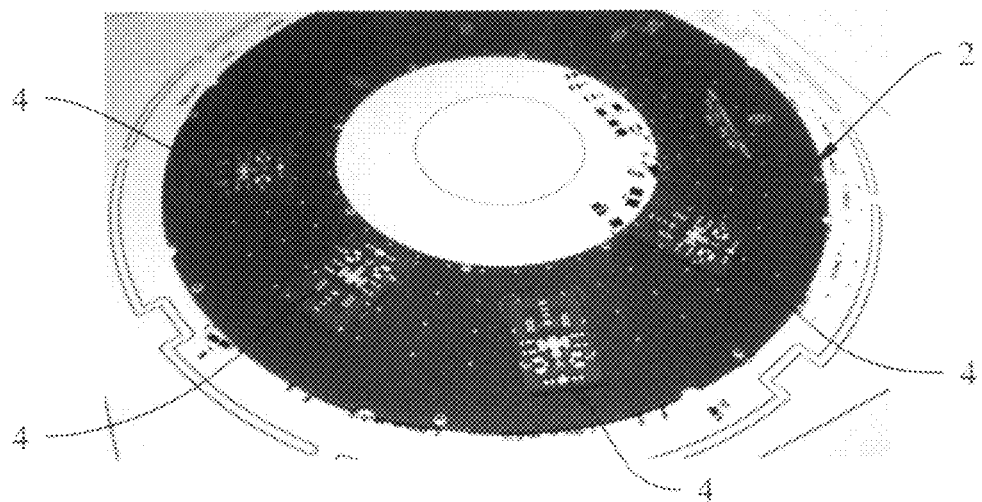
Fig. 6: Three-Dimensional Printed Circuit Board

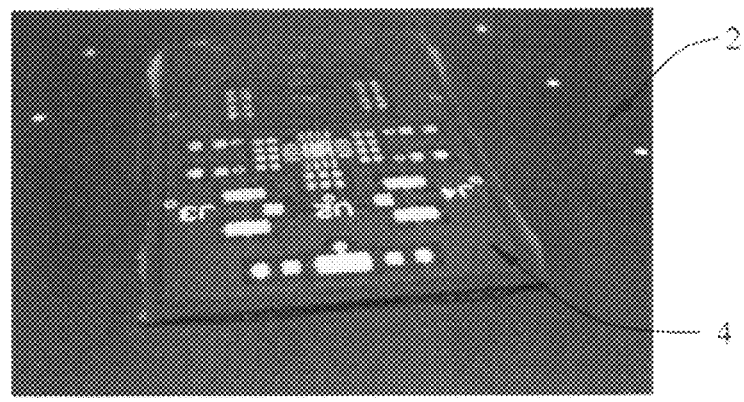
Fig. 7A: Three-Dimensional Printed Circuit Board Construction
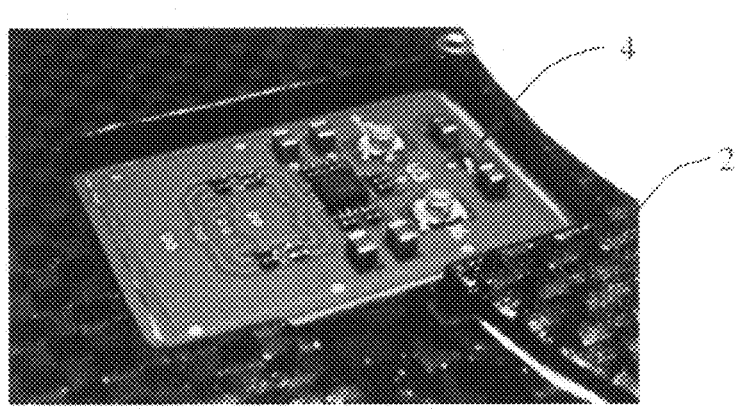
Fig. 7B: Three-Dimensional Printed Circuit Board Construction
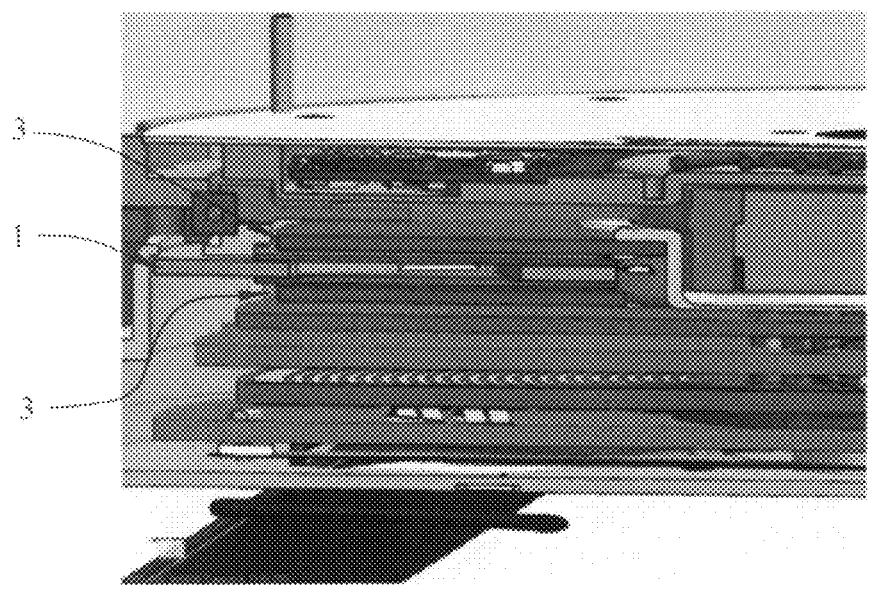
Fig. 8: Perspective Schematic of Improved Rotary Joint

INTEGRATED ROTARY JOINT ASSEMBLY WITH INTERNAL TEMPERATURE-AFFECTING ELEMENT

TECHNICAL FIELD

The present invention relates generally to slip-ring technology, and, more particularly, to improved slip-ring technology that allows reliable signal and power transmission through slip-rings over wider temperature ranges.

BACKGROUND ART

Devices for conducting signals between two members that are rotatable or movable relative to one another are well known in the art. Such devices, commonly known as rotary joints, include both slip-rings and twist capsules. Slip-rings are typically used when unlimited rotation between the members is desired, whereas twist capsules are used when only limited rotation between the members is required.

The challenges of transmitting high-frequency signals through rotary joints are compounded by fast edge speeds that pose bandwidth and impedance-matching constraints. Various techniques exist that extend high-frequency slip-ring technology, but the physical integration of active electronics into rotary joints is often challenging and is often constrained by thermal limitations, particularly at low temperatures. Low temperatures impair the functioning of electrical contacts and pose thermal challenges to electronics. Reliable operation of rotary joints under such conditions requires measures to ameliorate deleterious effects of the environment.

Examples of current high-frequency slip-ring technology are representatively shown and described in the following prior art patents:

| Pat. No. | Title |
| --- | --- |
| U.S. Pat. No. 6,956,445 B2 | Broadband High-Frequency Slip Ring System |
| U.S. Pat. No. 7,142,071 B1 | Broadband High-Frequency Slip Ring System |
| U.S. Pat. No. 7,559,767 B2 | High-Frequency Drum-Style Slip-Ring Modules |
| U.S. Pat. No. 8,283,993 B2 | Broadband Twist Capsules |
| U.S. Pat. No. 6,437,656 B1 | Broadband High Data Rate Analog And Digital Communication Link |
| U.S. Pat. No. 6,433,631 B2 | RF Slipring Receiver For Computerized Tomography System |

SUMMARY OF THE INVENTION

With parenthetical reference to the corresponding parts, portion or surfaces of the disclosed embodiment, merely for purposes of illustration and not by way of limitation, the present invention provides improvements in a slip-ring having a stator and having rotor, and including a brush having a proximal end mounted on one of the stator and rotor and having a distal end engaging the other of the stator and rotor, the brush being adapted to convey electrical signals across the interface between the stator and rotor.

The improvement broadly comprises: the rotor including a support member; and a track provided on the other of the stator and rotor, the track being arranged for sliding contact with the brush distal end; and a thermal element arranged within the support member for selectively affecting the temperature of the rotor; whereby the temperature operating range of the slip-ring may be increased.

The rotor may be a pancake-type rotor.

The thermal element may be a heater or a cooler.

The improvement may further include control electronics for operating the thermal element. The control electronics may be physically located within the support member.

The support member may have a recess, and the control electronics may be physically located within this recess.

The support member may be a printed circuit board. The thermal element may be a trace within the printed circuit board.

The support member may be formed of a carbon fiber composite material.

Accordingly, the general object of the invention is to provide an improved slip-ring.

Another object is to provide an improved slip-ring with an internal thermal element arranged within a support member such that the temperature operating range of the improved slip-ring may be increased.

These and other objects and advantages will become apparent from the foregoing and ongoing written specification, the drawings, and the appended claims.

BRIEF DESCRIPTION OF THE DRAWINGS

FIG. 1 is a fragmentary schematic vertical sectional view of a portion of a pancake-type slip-ring rotor, showing the thermal element and the control electronics positioned within a recess in the support member.

FIG. 2 is a fragmentary schematic exploded vertical sectional view of the upper six-layer printed circuit board shown in FIG. 1, incorporating first and second heating traces as internal layers 3 and 4.

FIG. 3 is a fragmentary horizontal sectional view thereof, taken generally on line 3-3 of FIG. 2, showing a bottom plan view of one of the heating element traces identified in FIG. 2 as "Layer 4".

FIG. 4 is an isometric view of a rotor support member.

FIG. 5 is a top plan view of a rotor with a carbon fiber radial support member.

FIG. 6 is a perspective view of a printed circuit board support member with certain additional control circuit boards attached thereto.

FIG. 7A is a perspective view of a three-dimensional printed circuit board.

FIG. 7B is another perspective view of a three-dimensional printed circuit board.

FIG. 8 is a schematic isometric view of an improved rotary joint.

DETAILED DESCRIPTION OF THE PREFERRED EMBODIMENTS

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

Devices in which an electrical conductive brush slides on an electrical conductive ring to transfer electrical power and signal between a rotor and stator are known as electrical slip-rings. Conventional approaches to extending the operation of slip-rings to lower temperatures (e.g., −50 to −60° C.) involve proper electrical contact design, as well as the proper choice of boundary lubricant. Electrical current flows between contacts via metal asperities (i.e., roughness or unevenness of surface) on each contact member that supports the load between the contacts. The boundary lubricant also supports a portion of the contact load. If the viscosity of the lubricant increases such that the contact pressure on the metal asperities is reduced, electrical power and signal can be interrupted. As the surface speed of the rotor increases, hydrodynamic lift can occur, and the circuit may open. This effect can be circumvented, at least in part, by raising the temperature of the assembly.

Increasing the operating temperature range of the slip-ring can also benefit the electronics that are part of the rotary joint. A conventional solution to extending the low-temperature range is by active heating, such as by use of a monolithic or perimeter band heater to raise the temperature of an assembly. Such an approach can be effective, but has the disadvantage of not delivering heat efficiently and directly to the most critical components. Typical approaches to integrating electronics into rotary joints also present challenges in physically accommodating discrete heating devices and thermal control mechanisms inside a dense assembly.

The present invention provides improved integrated rotary joint assemblies with active control electronics therewithin, and features a novel space-efficient construction that utilizes a unique radial support hub or member for mounting one or more pancake-type slip-rings, with internal integration of active and passive electronic devices within the support structure. Further claims of this invention include the use of intelligent microprocessor control of heating and cooling of the rotary joint assemblies to extend the electrical and environmental operating ranges of rotary joints.

The present disclosure describes thermal and space management technologies that can extend the operational range of slip-rings to higher frequencies and wider temperature ranges than may otherwise be practical using conventional techniques.

The present invention addresses these deficiencies by means of an integrated rotary joint assembly that incorporates electronics and thermal mitigation inside of printed circuit board ("PCB") rotary-joint subassemblies.

FIG. 1 illustrates the nature of an invention that offers improvements over the prior art. In FIG. 1, a radial plate (1) serves to mount planar rotary joint assemblies (2) and provides internal volumes recesses to contain electronic components, such as integrated circuits ("ICs") (6) and wiring (5). Traces (3) for selectively heating the components are provided within the joint assemblies (2), and thermoelectric coolers ("TECs") (4) for selectively heating, cooling and/or thermally isolating the components are provided in the recesses within radial plate (1). FIG. 1 also shows a plurality of stator-mounted brushes slidably engaging tracks, represented by concentric bold lines, on the upper and lower surfaces of the upper and lower rotary joint assemblies, respectively.

The advantages of the integration of electronics and wiring inside the rotary joint assembly and radial plate include: (a) size and weight savings from the sharing of space within the assembly envelope, (b) improved high-frequency performance resulting in reduced losses and improved impedance matching, (c) localized heating of components by means of printed circuit board heating elements incorporated inside the rotary joint assemblies for extending the low-temperature operating range, (d) use of a thermoelectric device (4) incorporated into the rotary joint assembly to provide heating, cooling, and/or thermal isolation to extend both low- and high-temperature limits for active control devices, such as IC's (6), microprocessors, clock data recovery devices, and field-programmable gate arrays ("FPGAs") (not shown), (e) intelligent heat management of rotary joint heating cores and thermoelectric coolers ("TECs") by means of onboard sensors and microprocessor controls, and (f) reduced emissions and improved shielding provided by the radial plate (1).

The use of a carbon fiber or similar composite construction in the radial mounting plate provides electromagnetic interference ("EMI") shielding comparable to metals and allows the inclusion of RF absorptive materials within the assembly to absorb and attenuate electromagnetic fields.

FIG. 2 illustrates a 6-layer PCB rotary joint assembly (2) incorporating heating elements implemented as trace layers within the PCB stack. Such heating layers can be realized by conventional copper traces, such as illustrated in FIG. 3, or by use of high-resistivity materials, such as nickel alloys, that allow higher resistance traces to be constructed in a more compact configuration. FIG. 3 shows a heating trace (3). Printed circuit board structures incorporating integral heating cores into their structure can extend the low temperature operation range of contacting rotary joints by heating of the structure, as well as extending the low-temperature range of the electronics integrated into the assembly, as shown in FIG. 1. FIG. 2 is an exploded view of the upper planar rotary joint assembly (2) shown in FIG. 1, depicting a heater core in the center, bond layers above and below the heater core, and PCB cores above and below the bond layers. More particularly, the upper PCB core is shown as having Layers 1 and 2 on its upper and lower surfaces, respectively; the heater core is depicted has having a first heater trace on its upper surface (Layer 3) and a second heater trace on its lower surface (layer 4), and the lower PCB core is shown having a Layer 5 on its upper surface, and a Layer 6 on its lower surface. The upper PCB core has tracks on its uppermost surface that are slidably engaged by the brushes shown in FIG. 1. The lower PCB core in FIG. 2 has contacts that communicate with the IC circuitry and other system components. The solid lines in FIG. 2 are vias that electrically communicate the tracks with other internal structure.

The physical support for rotary joint components is provided by a radial plate or support structure (1), such as shown in FIG. 4. FIG. 1 also shows the radial mounting plate, providing the mounting base for printed circuit board structures mounted on upper and lower surfaces. The radial support structure provides several significant features for the invention; that is, it: (a) provides stiff mounting surfaces for rotary joint structures, such as printed circuit boards for sliding electrical contacts or non-contacting signal transfer, (b) provides internal cavities or recesses for the placement of components and active electronics, including thermoelectric and control devices, (c) provides internal cavities for the routing of cabling and wiring, (d) provides shielding to protect electronics from internal and external EMI, and (e) provides space for incorporating RF absorber materials, or if made of carbon-fiber or other composite material, provides structural, shielding, and absorptive properties.

FIG. 5 is a photograph of the prototype of this invention, embodying eight channels of 3.125 Gigabits per second ("Gbps") high-speed digital channels, with integral drive electronics and thermal management. FIG. 5 depicts a heating trace (3) mounted on the heater core (FIG. 2) as Layer 4. The radial support case in this prototype is carbon fiber composite. The use of carbon fiber composite results in a flat and stiff structure that can operate with a closer board spacing, and can require lower transmit power. The shielding properties of the carbon fiber composite reduce electromagnetic emissions and susceptibility, as well as reducing channel to channel crosstalk. Radio frequency absorptive materials can be included in the assembly to further absorb and attenuate EM fields.

Three-Dimensional PCB Construction

An embodiment of the integrated rotary joint assembly is the use of three-dimensional PCB construction, as shown in FIG. 6. FIG. 6 depicts four PCB modules, each containing a TEC (4), on a planar rotary joint assembly (2). The use of three-dimensional PCB construction allows for the creation of PCB circuit modules constructed at the same time as the main PCB construction and integrated into the main PCB. The advantages of this technique include the ability to optimize small circuit boards with different characteristics than the main board, with gains to space and weight savings and signal integrity. The three-dimensional PCB construction is also advantageous from the standpoint of an integrated rotary joint assembly, as it allows for optimal use of the total physical volume. FIG. 7A and 7B depict a PCB module, containing a TEC (4), mounted on a rotary joint assembly (2).

Microprocessor Control and Health Monitoring of Rotary Joints

Active heating and cooling of a rotary joint assembly can be accomplished by means of a microprocessor-based thermal management system integrated into the assembly. Temperature sensors installed inside of an integrated rotary joint assembly and integral to some integrated circuits can provide data to support intelligent control of temperature in the assembly by means of an onboard microcontroller and support circuitry to control heating and cooling devices.

Incorporation of resistance heaters inside an assembly can greatly extend the low temperature operational envelope of the device, but a similar expansion of the high temperature limits requires a means of cooling the assembly. The incorporation of thermoelectric coolers ("TECs") into an assembly can provide cooling capability as well as heating capability, because of the heat pump mode of TEC devices. The TECs can be advantageously used in three operating modes: active cooling, active heating, and unpowered as passive thermal isolation. The normal cooling mode of a thermo-electric device moves heat from a heat-generating device into an adjacent structure that serves at a heat sink, significantly reducing the temperature of the heat-generating component and allowing operation at higher ambient temperatures than would otherwise be possible. Likewise, low temperature operation of the assembly can be extended by reversing direction of current flow through the TEC and the direction of heat transfer, moving heat from the surrounding environment and transferring it to electronic devices that may be near their low temperature limit. The heat transfer from the environment combined with self-heating of the TEC allows operation at temperatures lower that would otherwise be practical. Additionally, when unpowered, the TEC serves as a thermal isolator to avoid excessive cooling of electronic devices that would otherwise occur with a passive heat sink. The use of microcontrollers and control software that can flexibly utilize onboard heating devices and all the three operating modes of thermoelectric coolers can provide significant expansion of wider operational thermal envelopes than would otherwise be practical.

An embodiment of the control mechanism outlined above is by use of a microprocessor-controlled H-bridge control circuit, which allows control voltage to be applied to the TEC in either direction under microprocessor control. Software algorithms monitoring temperature data can selectively apply current to heating elements in any duty cycle and also to selectively control the operation of TEC operation modes, heat, cool, or thermally isolate devices, as required, to implement flexible strategies of thermal mitigation of integrated assemblies. The use of both resistive heating and thermoelectric devices is advantageous to expanding both the high and low thermal envelope limits. FIG. 7A illustrates details of the three-dimensional construction of a printed circuit board ("PCB"). The incorporation of a sub-PCB onto a simpler main-PCB allows for the incorporation of more complex functionality into an integrated structure. The sub-PCB is shown without electronics for the purpose of illustration. FIG. 7B depicts a partial assembly of an integrated rotary joint with a sub-PCB nested inside a carbon support structure.

FIG. 8 is a schematic isometric view of an improved integrated rotary joint inside a larger slip-ring assembly, this view showing the pancake-type rotor, the tracks, the brush and the stator. The structure shown in FIG. 1 is shown embedded within the larger slip-ring assembly. FIG. 8 depicts heater traces (3) on opposite sides of a radial plate (1). There are three slip-ring platters in this assembly and all three have serpentine heaters to keep the lubricant from lifting the brushes at low temperature. The serpentine heating elements can also warm the electronics at low temperature. However, at elevated temperature, the sliding contacts will continue to work, whereas the electronics may exceed their operating temperature range, thus the need for incorporating a TEC in close proximity to the electronics to provide cooling at elevated temperature. The invention allows for the efficient integration of a complex module within a dense assembly that would otherwise have a severe space constraint.

Therefore, the present invention broadly provides improvements in a slip-ring having a stator and having rotor, and including a brush having a proximal end mounted on one of the stator and rotor and having a distal end engaging the other of the stator and rotor, the brush being adapted to convey electrical signals across the interface between the stator and rotor. The improvement broadly comprises: the rotor including a support member (1); and a track provided on the other of the stator and rotor, the track being arranged for sliding contact with the distal end; and a thermal element (3 or 4) arranged within the support member for selectively affecting the temperature of the rotor; whereby the temperature operating range of the slip-ring may be increased.

Modifications

The present invention contemplates that many changes and modifications may be made. For example, the thermal element may be a heater or a cooler. The control electronics may be physically located within the support member, for example, in a recess provided in the support member. The thermal element may be a trace within a printed circuit board.

Therefore, while a preferred form of the improvement has been shown and described, and several modifications thereof, discussed, persons skilled in this art will readily appreciate that various additional changes and modifications may be made without departing from the spirit of the invention, as defined and differentiated by the following claims.

What is claimed is:

1. In a slip-ring having a stator and having rotor provided with a track, and including a brush having a proximal end mounted on said stator and having a distal end slidably engaging said rotor track, said brush being adapted to convey electrical signals across an interface between said stator and rotor, the improvement which comprises:

said rotor including a support member;
a thermal element arranged within said support member for selectively affecting the temperature of said rotor; and
control electronics physically located within said support member for operating said thermal element such that the temperature of said rotor over an operating temperature range may be increased;
whereby the operating temperature range of the slip-ring may also be increased.

2. The improvement as set forth in claim 1 wherein said rotor is a pancake -type rotor.

3. The improvement as set forth in claim 1 wherein said thermal element is a heater.

4. The improvement as set forth in claim 1 wherein said thermal element is a thermoelectric cooler.

5. The improvement as set forth in claim 4 wherein said thermoelectric cooler may be selectively operated to either heat or cool said slip-ring, or to act as a thermal isolator.

6. The improvement as set forth in claim 1 wherein said support member has a recess, and wherein said control electronics are physically located within said recess.

7. The improvement as set forth in claim 1 wherein said support member is a printed circuit board, and wherein said thermal element is a trace within said printed circuit board.

8. The improvement as set forth in claim 1 wherein said support member is formed of a carbon fiber composite material.

* * * * *